US010439310B2

(12) United States Patent
Perez et al.

(10) Patent No.: US 10,439,310 B2
(45) Date of Patent: Oct. 8, 2019

(54) CIRCUIT ASSEMBLY PIN

(71) Applicants: Edward Perez, Medley, FL (US); Thomas Michael Borkes, Orlando, FL (US)

(72) Inventors: Edward Perez, Medley, FL (US); Thomas Michael Borkes, Orlando, FL (US)

( * ) Notice: Subject to any disclaimer, the term of this patent is extended or adjusted under 35 U.S.C. 154(b) by 242 days.

(21) Appl. No.: 14/668,961

(22) Filed: Mar. 25, 2015

(65) Prior Publication Data

US 2016/0285182 A1 Sep. 29, 2016

(51) Int. Cl.

| | |
|---|---|
| ***H01R 9/05*** | (2006.01) |
| ***H01R 12/70*** | (2011.01) |
| ***H01R 13/02*** | (2006.01) |
| ***H01R 13/04*** | (2006.01) |
| ***H01R 13/62*** | (2006.01) |
| ***H01R 4/48*** | (2006.01) |
| ***G01R 1/04*** | (2006.01) |
| ***G01R 1/06*** | (2006.01) |
| ***G01R 31/02*** | (2006.01) |
| ***G01R 31/28*** | (2006.01) |
| ***G01R 31/27*** | (2006.01) |
| ***H01R 12/73*** | (2011.01) |
| *H01R 13/03* | (2006.01) |

(52) U.S. Cl.
CPC ........... *H01R 12/737* (2013.01); *H01R 13/03* (2013.01)

(58) Field of Classification Search
CPC .......... H01R 9/05; H01R 12/20; H01R 12/70; H01R 13/02; H01R 13/04; H01R 13/62; H01R 4/48; G01R 1/0416; G01R 1/067; G01R 31/02; G01R 31/2889
USPC ............ 324/763.01; 439/324, 567, 582, 585, 439/626, 660, 700, 717, 851, 853, 873, 439/876, 884, 891
See application file for complete search history.

(56) References Cited

U.S. PATENT DOCUMENTS

| | | | | |
|---|---|---|---|---|
| 3,187,298 A * | 6/1965 | Shannon | H01R 12/718 | 439/851 |
| 5,502,769 A * | 3/1996 | Gilbertson | H04R 25/556 | 381/309 |
| 5,667,410 A * | 9/1997 | Johnston | G01R 1/06722 | 439/700 |
| 6,081,996 A * | 7/2000 | Kruppa | H01R 12/57 | 29/834 |
| 6,814,590 B2 * | 11/2004 | Minich | H01R 12/727 | 439/79 |
| 7,567,089 B2 * | 7/2009 | Chen | G01R 1/0483 | 324/755.11 |

(Continued)

*Primary Examiner* — Neel D Shah

(74) *Attorney, Agent, or Firm* — Gregory L. Mayback; Dickinson Wright PLLC

(57) ABSTRACT

A circuit assembly pin includes a barrel, and the barrel has a substantially cylindrical profile. The barrel is be received by socket on a first circuit board. The pin also includes a body connected to the barrel, and the body has a substantially rectangular cuboid profile. The body also includes a set of protrusions. The set of protrusions includes a set of legs to be inserted to a second circuit board. The set of protrusions comprises a substantially rectangular cuboid profile generally free of projections or depressions. The set of protrusions is substantially perpendicular to the barrel such that the first circuit board is substantially perpendicular to the second circuit board.

17 Claims, 10 Drawing Sheets

(56) References Cited

U.S. PATENT DOCUMENTS

| | | | | |
|---|---|---|---|---|
| 2003/0062692 | A1* | 4/2003 | Diez | F16J 15/0825 277/591 |
| 2004/0147177 | A1* | 7/2004 | Wagner | H01R 12/7088 439/855 |
| 2010/0263915 | A1* | 10/2010 | Shiraiwa | H05K 1/0201 174/252 |
| 2011/0073345 | A1* | 3/2011 | Sato | H01R 9/24 174/50 |
| 2011/0316341 | A1* | 12/2011 | Pichkur | H01R 13/6675 307/72 |
| 2013/0005194 | A1* | 1/2013 | Ozawa | H01H 85/2035 439/698 |
| 2013/0095702 | A1* | 4/2013 | Golko | H01R 13/6273 439/676 |
| 2016/0049743 | A1* | 2/2016 | Betz | H01R 13/415 439/733.1 |

* cited by examiner

PRIOR ART

500

CIRCUIT ASSEMBLY PIN

BACKGROUND

The assembly of electronic products in high labor rate markets has become less competitive as manufacturing has been moved to locations where low labor rate employees are easily employable. This approach reduces the labor cost for the product. An effective way for operations in high labor rate markets to counteract this disparity and reduce or eliminate this competitive disadvantage is to find ways to reduce labor content, essentially reducing the number of labor hours per product. An effective way to accomplish this is to create a machine-build or automate the product assembly process. One of the existing labor-intensive operations involved in circuit board assembly is having to hand-solder components to the circuit board. This has been the case for components that are used to interconnect one circuit board to another. One category of components that are an example of this requirement is called "connector assemblies." These assemblies consist of a "male" half (commonly referred to as a "plug" or "pin") that is soldered to one circuit board and a "female" half (commonly referred to as a "socket" or "receptacle") that is soldered to another circuit board. After these two halves of a connector assembly are soldered to their respective circuit boards, the two circuit boards can be interconnected by pressing the male, pin half into the female, socket half.

Automating the soldering of an existing right-angle pin (see FIG. 1) has been especially problematic because, typically, a unique machine (robot) is required access and insert the pins into the circuit board. This adds considerable cost, both the capital cost of purchasing the equipment, and the recurring cost of needing a separate process to insert the pin. In addition, it should be noted that soldering the pin (instead of merely mechanically swaging or interference fitting to maintain the connect pin orientation) is required in high frequency and other applications to ensure electrical interference is not introduced into the circuit. Electrical interference can adversely affect the performance of the product.

SUMMARY OF THE INVENTION

Aspects of the invention overcome the deficiencies of prior art by maintaining the proper orientation of the right-angle pin during the automated reflow soldering process. This is accomplished by designing the pin with two "feet" that protrude from the pin's body and are inserted into the circuit board. Embodiments of the invention not only permit the total automation of a right-angle pin connector to a circuit board, but also accomplish this automation and subsequent precision of the insert of the pins without the requirement of any additional automation equipment. The automation equipment needed to assemble the invention to a circuit board is the same equipment that is used to assemble the other traditional components on the circuit board.

Figure 1:
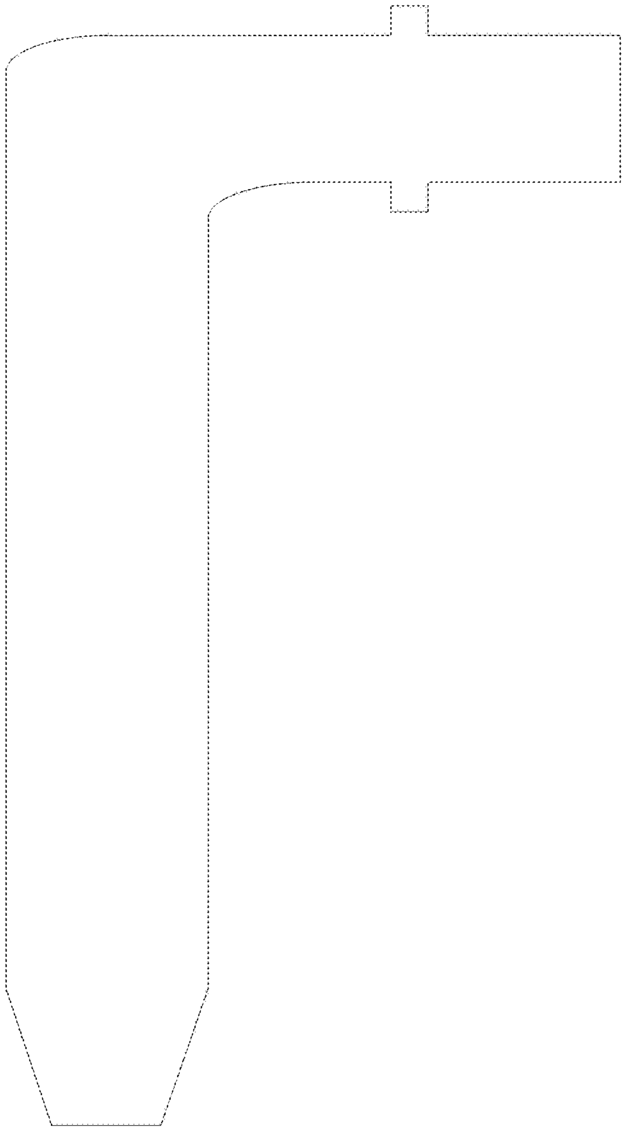
FIG. 1 is a prior art design of a circuit assembly pin.

The accompanying drawings, which are incorporated in and form a part of the specification, illustrate the embodiments of the present invention and, together with the description, serve to explain the principles of the invention.

The drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments as defined by the appended claims.

DETAILED DESCRIPTION

Figure 2:
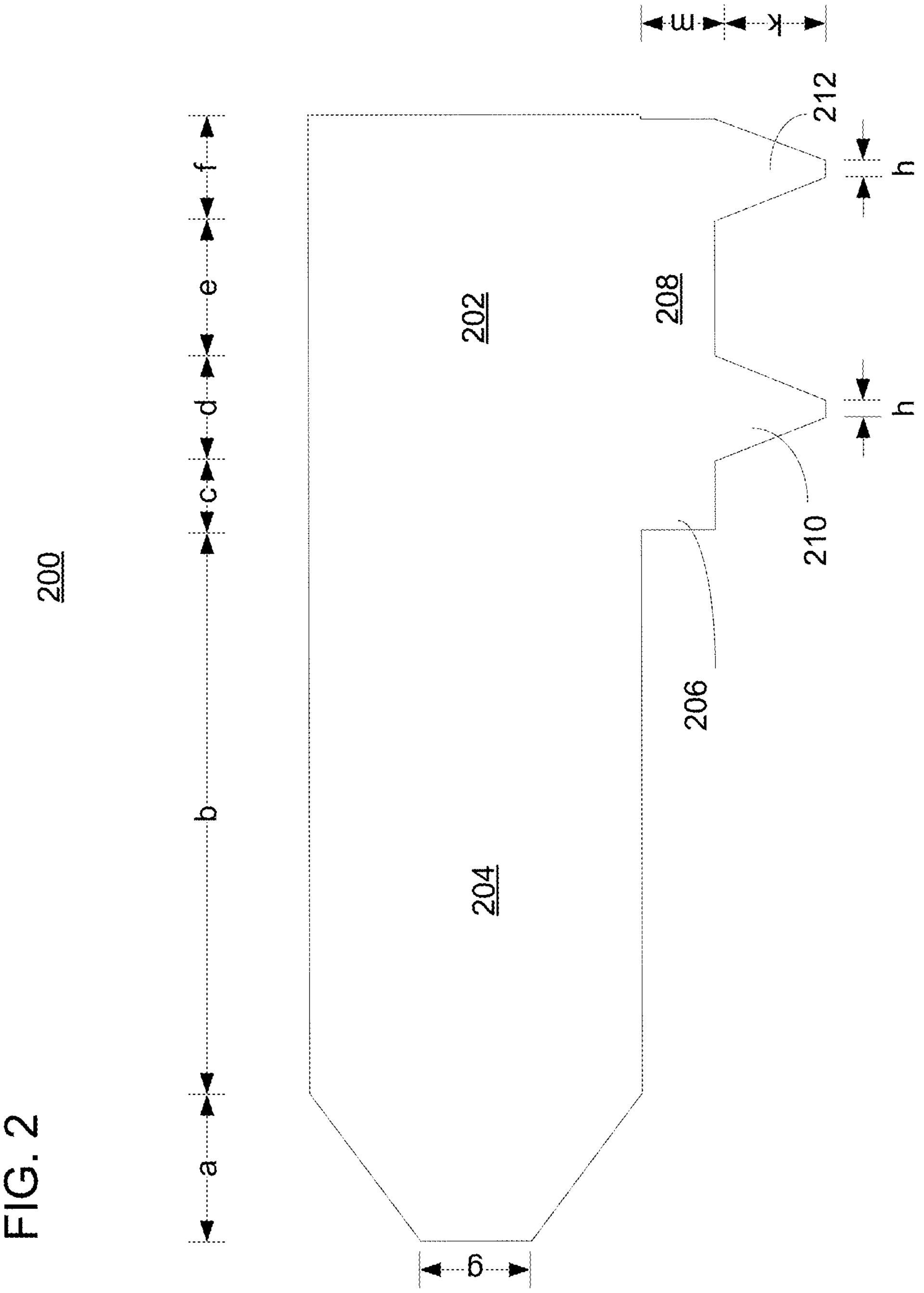
FIG. 2 is a side view of a circuit assembly pin according to one embodiment of the invention.

Embodiments of the invention improve over prior designs by modifying the design of a circuit assembly pin with efficiency in automated insertions on the circuit boards by automated machines. Referring now to FIG. 2, a side view, not drawn to scale, of a circuit assembly pin 200 according to one embodiment of the invention is shown. In one example, the circuit assembly pin 200 may be made of materials including 260 Brass class of alloy. In another embodiment, the circuit assembly pin 200 may have a finish of 10 Micro-inches of gold in average, measured in accordance with ASTM B488, on 50-100 micro-inches of Nickel. It is to be understood that other alloys, electrically conductive materials, or finishes may be used without departing from the scope or spirit of the invention. In another embodiment, the circuit assembly pin 200 may be coated with electrically conductive materials to enhance or strengthen electrical conductivity other than the finishing described above.

Figure 6:
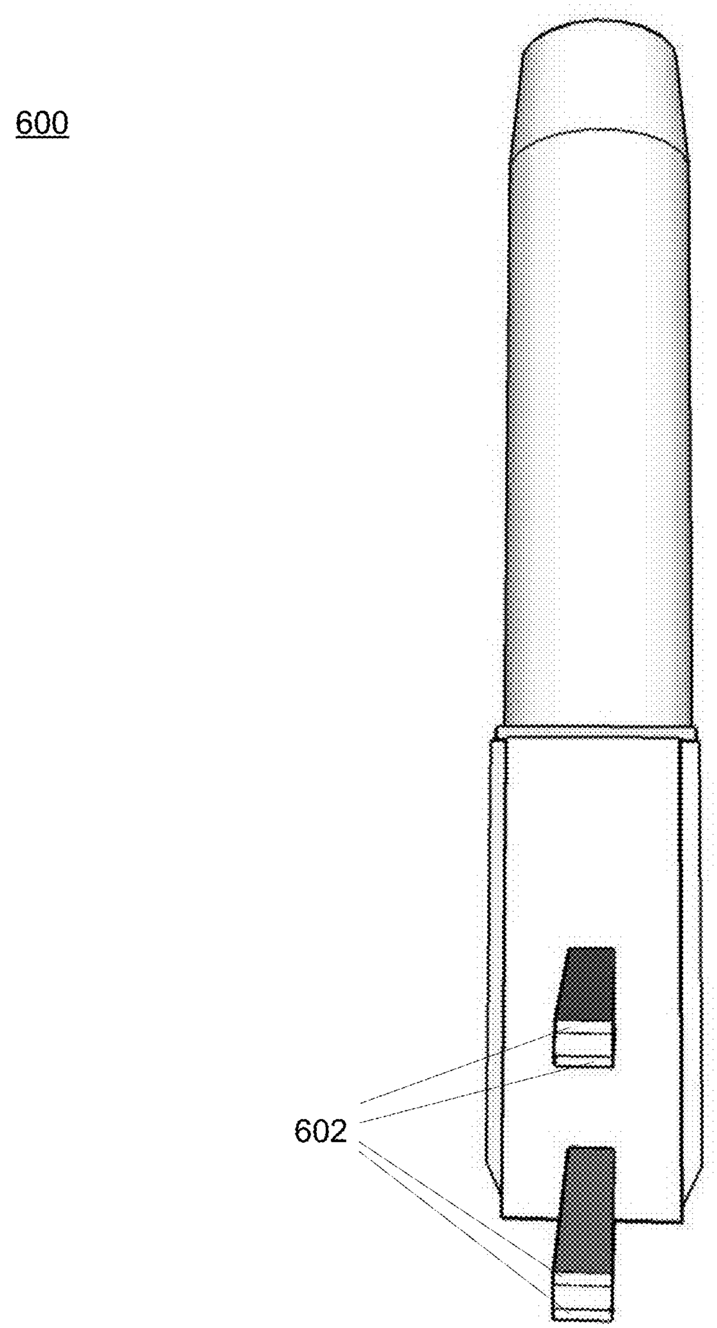
FIG. 6 is a bottom view of a circuit assembly pin according to one embodiment of the invention.
Figure 7:
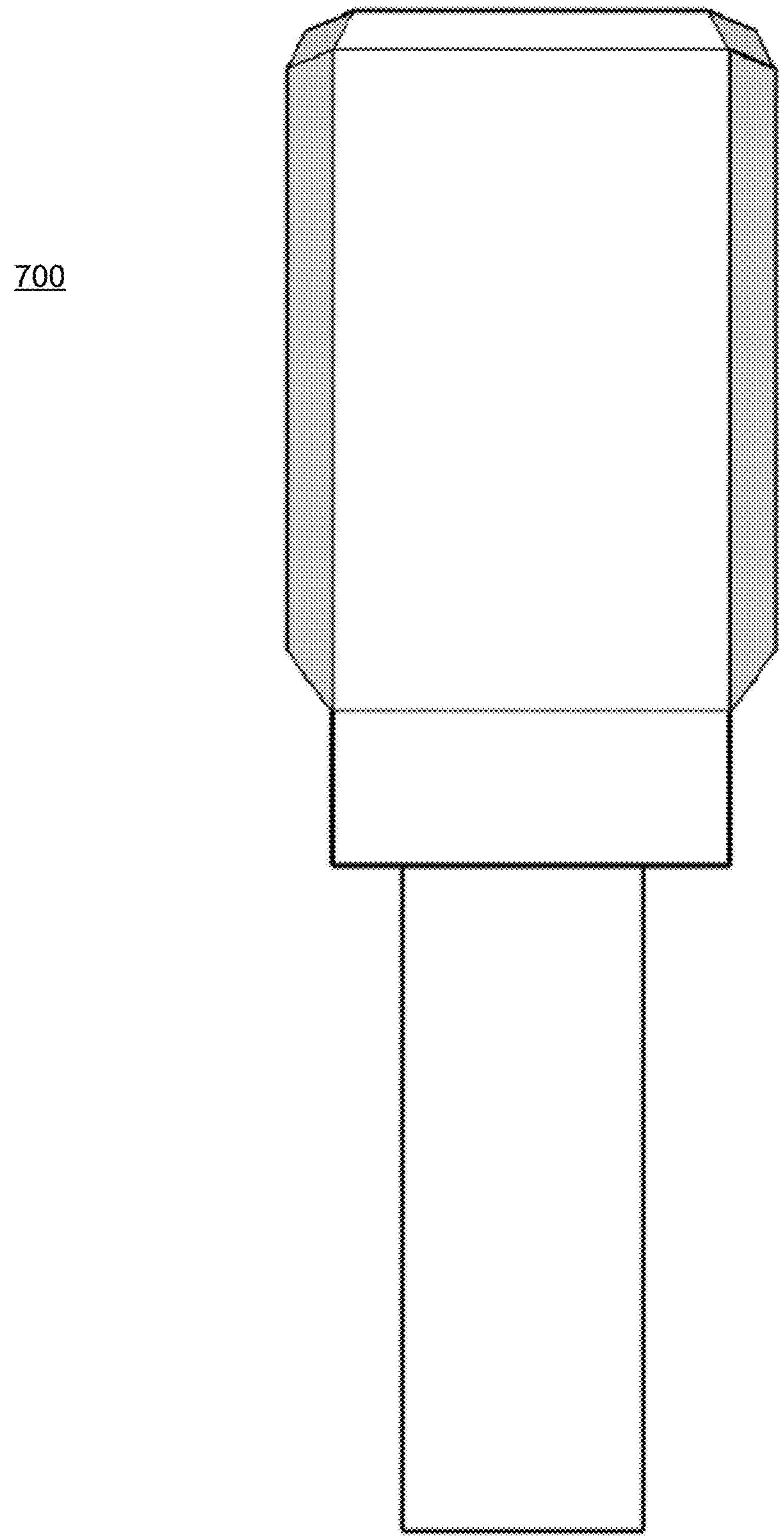
FIG. 7 is an end view of a circuit assembly pin according to one embodiment of the invention.
Figure 8:
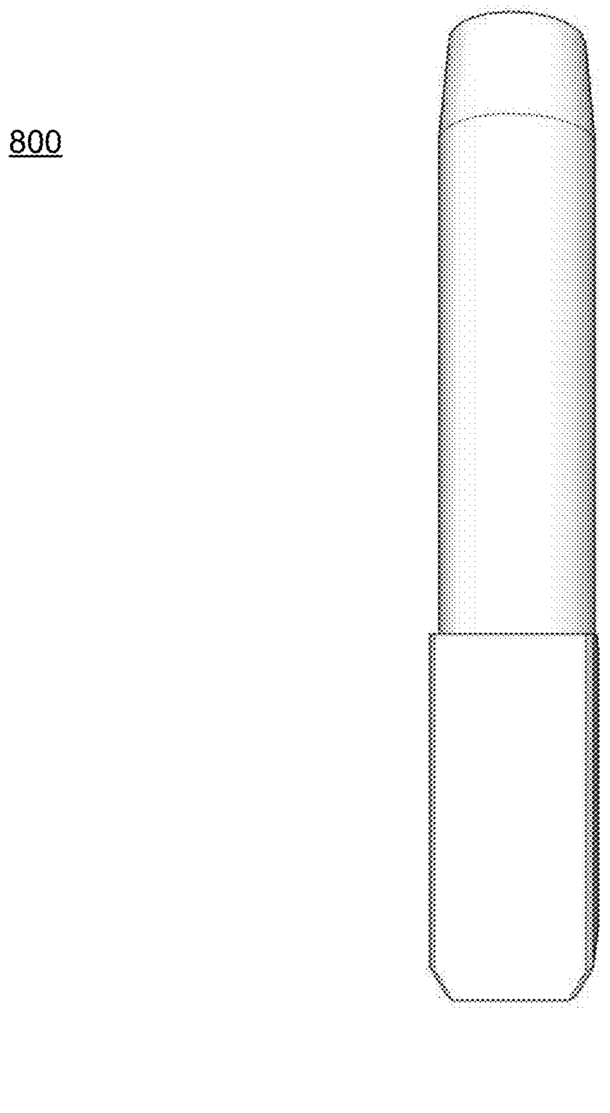
FIG. 8 is a top view of a circuit assembly pin according to one embodiment of the invention.

Still referring to FIG. 2, the circuit assembly pin 200 includes a body 202 and a barrel 204. The body 202 includes a fin 206 and a web 208. In one embodiment, the web 208 includes a set of two legs 210 and 212. In one example, the circuit assembly pin 200 includes the following exemplary measurements associated with the pin 200, where the reference measurements may be found in FIGS. 1-4:

a=about 0.060 inches;
b=about 0.240 inches;
c=about 0.070 inches;
d=about 0.030 inches;
e=about 0.070 inches;
f=about 0.030 inches;
g=about 0.020 inches;
h=about 0.020 inches;
i=about 0.032 inches;
j=about 0.040 inches (diameter);
k=about 0.082 inches;
m=about 0.060 inches;

In one example, the barrel 204 is inserted into a socket of a first circuit board (not shown). In this example, the barrel 204 includes a substantially cylindrical profile. On the other hand, the body 202 includes a substantially rectangular cuboid profile, see also the frontal view in 500 in FIG. 4, the bottom view 600 in FIG. 6, the end view 700 in FIG. 7, the top view 800 in FIG. 800, and the perspective views 900 and 1000 in FIG. 9 and FIG. 10. It is to be understood that other polyhedrons with or without curved edges may be used without departing from the scope and spirit of the invention. For example, in FIG. 6, a distal end of each of the legs (e.g., legs 201 and 212) may include chamfer. In this embodiment, the chamfer may provide efficiency and easy for a pick and place machine to insert the legs into a circuit board. As such, the fin 206, the web 208, and the legs 210 and 212 also include a similar rectangular cuboid profile. In one embodiment, the set of legs 210 and 212 are received at a set of sockets of a second circuit board (not shown). As such, the first circuit board is positioned substantially perpendicular to the second circuit board.

In one embodiment, the body 202 includes a set of protrusions that includes the set of legs 210 and 212. In another embodiment, the set of protrusions that includes the fin 206 and the web 208. In a further embodiment, the set of protrusions having the set of legs 210 and 212 is substantially perpendicular to the barrel 204. For example, the angle between the set of legs 210 and 212 and the barrel 204 is substantially a right-angle (90 degrees).

The set of legs 210 and 212 has a second length to be inserted to a circuit board (not shown). In one embodiment, the set of legs 210 and 212 includes a substantially flat surface generally free of projections or depressions. As such, in this embodiment, the set of legs 210 and 212 and the body 202 have a slightly different physical profile. This embodiment nevertheless enhances and assists in the collection and orientation of the circuit assembly pin 200 by the pick-and-place machines in placement the circuit assembly pin 200 in the circuit board.

Figure 3:
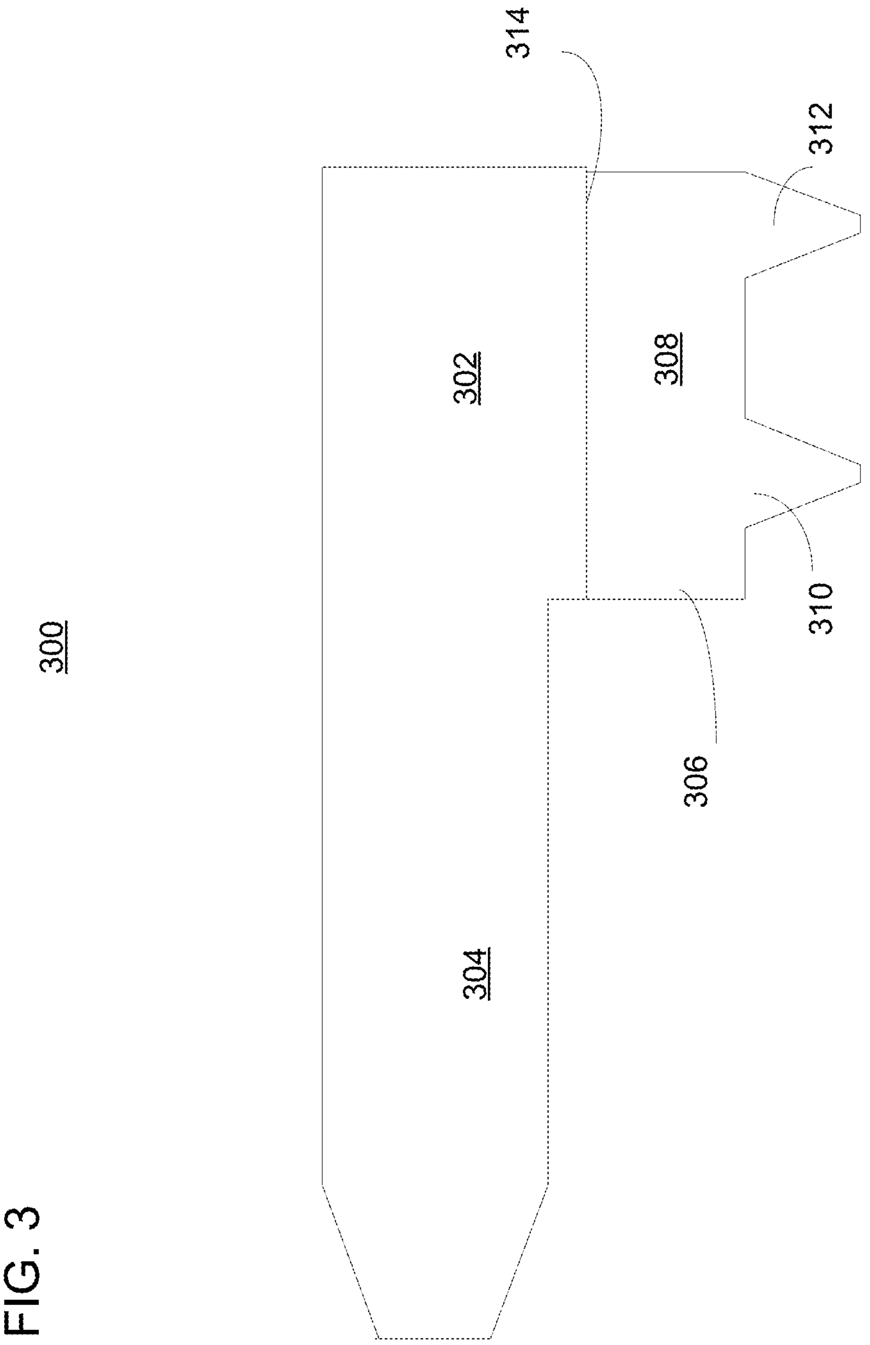
FIG. 3 is a side view of a circuit assembly pin according to another embodiment of the invention.
Figure 4:
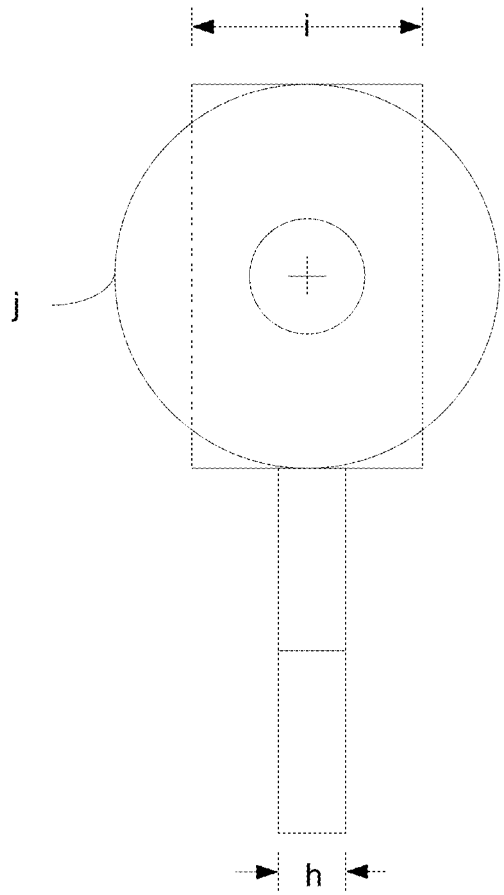
FIGS. 4-5 are frontal views of a circuit assembly pin according to one embodiment of the invention.
Figure 5:
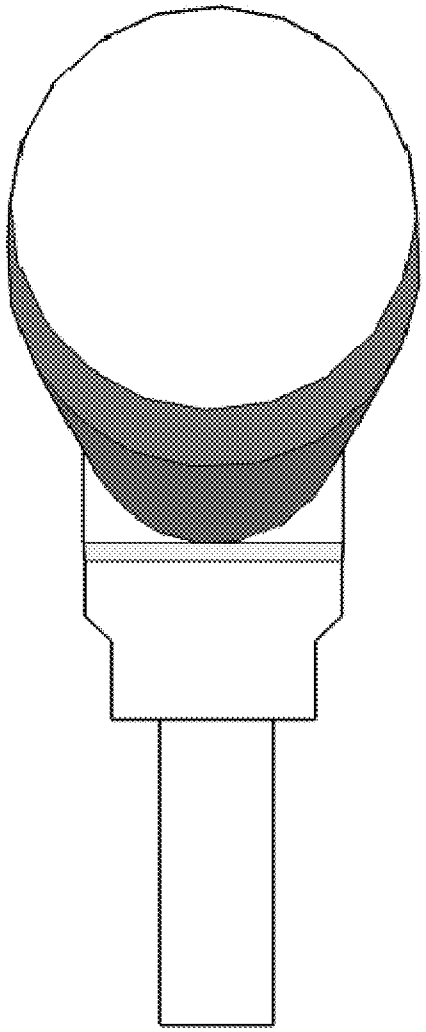
Figure 9:
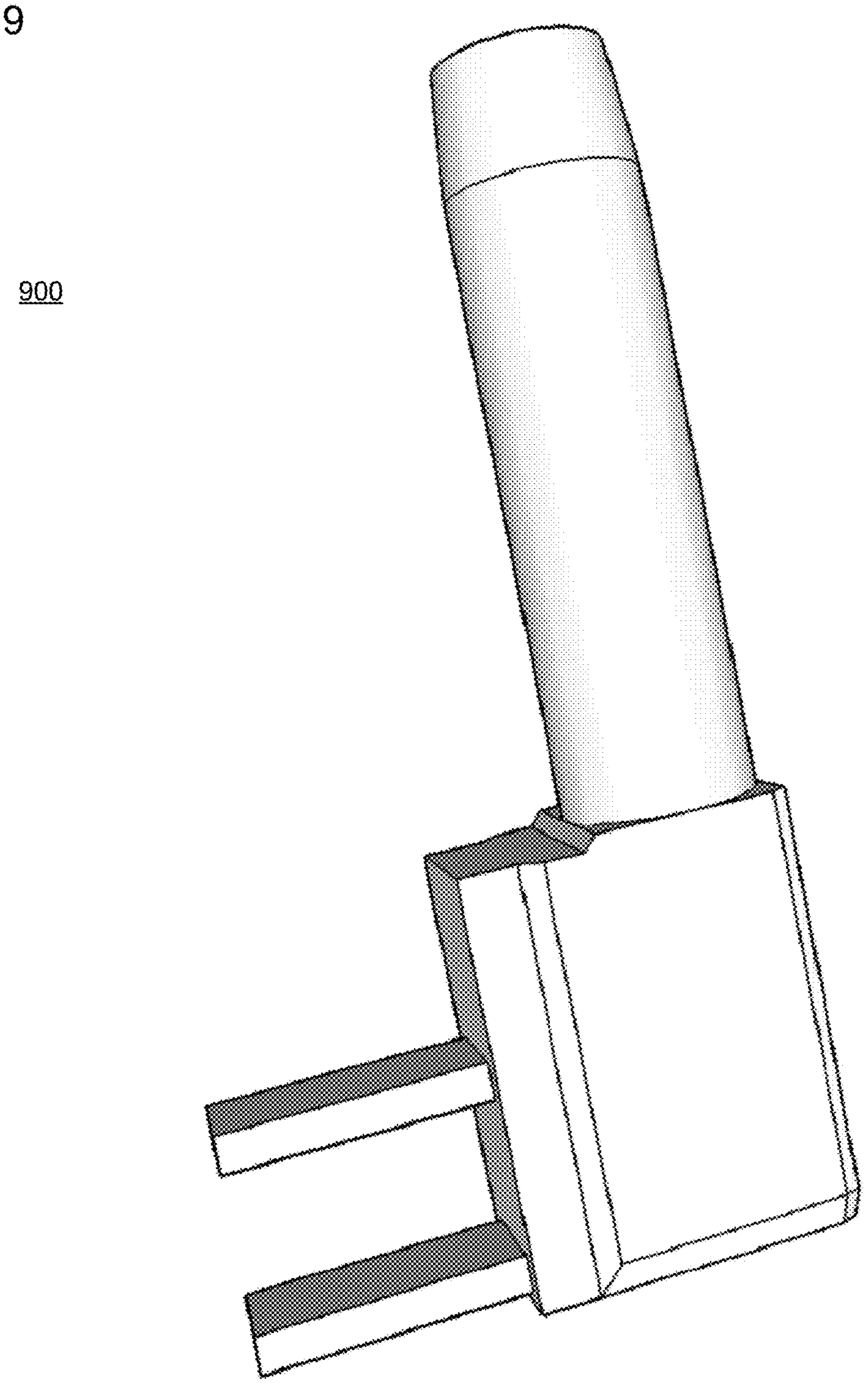
FIG. 9 is a perspective view of a circuit assembly pin according to one embodiment of the invention.
Figure 10:
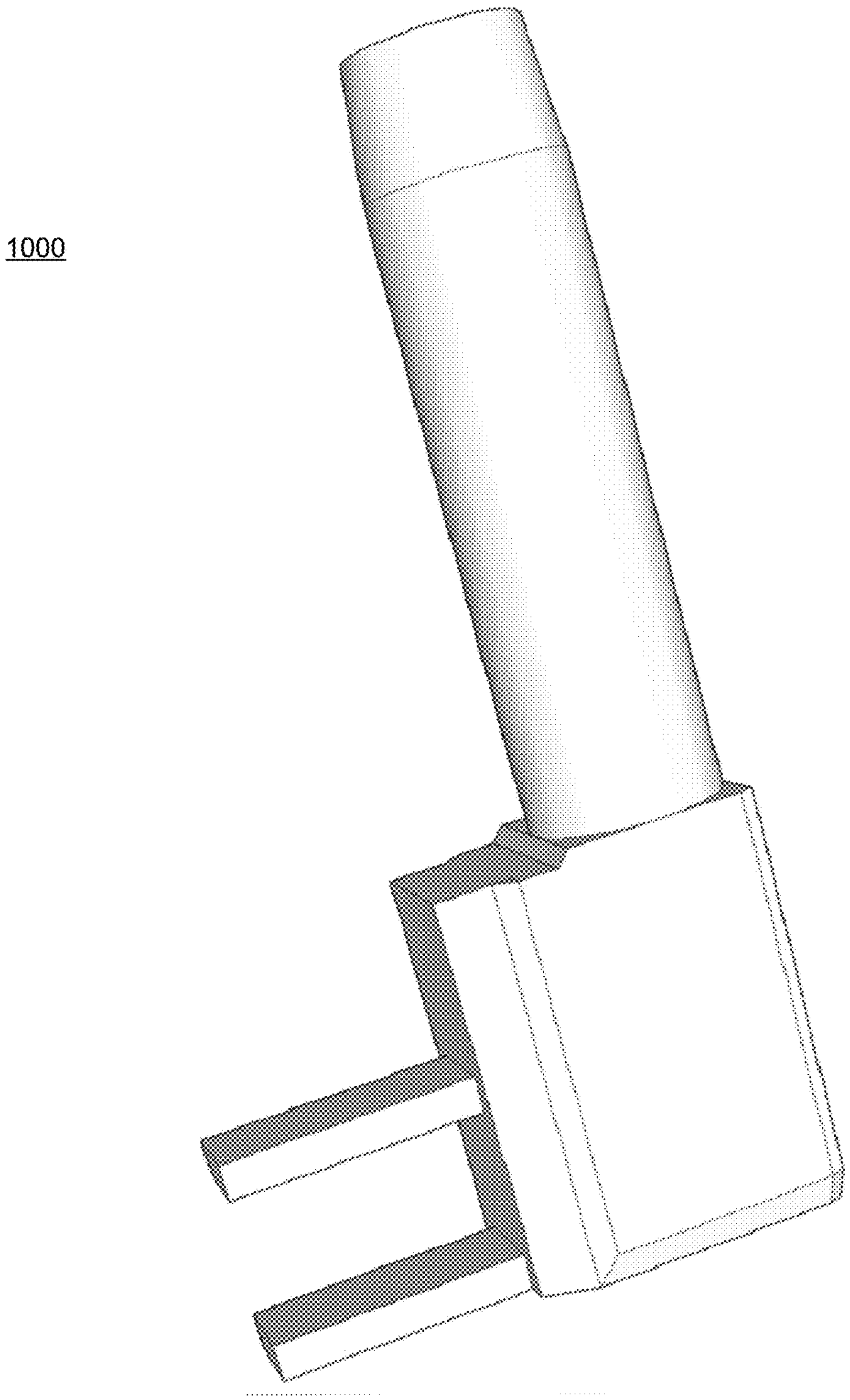
FIG. 10 is a perspective view of a circuit assembly pin according to another embodiment of the invention.

Referring to another embodiment of the invention, a side view of a circuit assembly pin 300 according to one embodiment of the invention is shown in FIG. 3. Similar to the circuit assembly pin 200, the circuit assembly pin 300 may also be a non-soldered circuit board pin or plug. In another embodiment, the circuit assembly pin 300 is composed of an electrically conductive alloy, including 260 Brass class of alloy. Also, the circuit assembly pin 300 also includes a barrel 304, a body 302, and the body 302 includes a set of protrusions including at least a set of legs 310 and 312. In another embodiment, the body 302 further includes a fin 306 and a web 308. In this embodiment, the web 308 being connected between the body 302 and the set of legs 310 and 3012. In this embodiment shown in FIG. 3, the barrel 304 includes a substantially cylindrical profile while the body 302 includes a substantially rectangular cuboid profile. See also a circuit assembly pin 900 in FIG. 9 and a circuit assembly pin 1000 in FIG. 10. In another embodiment, the circuit assembly pin 300 includes a slanted edge 314, see also FIG. 9, as the body 302 transitions to the web 308. In another embodiment, the body 302 may transition to the web 308 via a curved construction. It is to be understood other transitional construction or no transitional construction may be used without departing from the scope or spirit of the invention. Furthermore, as shown in FIG. 9, in one embodiment, the end of the body 302 and of the web 308 opposite the barrel 304 are flush. In another embodiment, as shown in FIG. 10, the end of the body 302 and of the web 308 is not flush or is slightly slanted with respect to one another. As such, it is to be understood whether the edge is flush or otherwise is a design choice and has no effect on the various aspects of the invention. It should be noted that small variations in dimensions may occur as an artifact of the cold flow forming and stamping processes.

In one embodiment, the circuit assembly pin 200 or circuit assembly pin 300 is comprised of one-piece electrically conductive material.

In one embodiment, the circuit assembly pin 200 or 300 is fabricated or manufactured from a coining fabrication process. Coining process is operated in a relative "cold working" working environment as compared to the typical stamping process which "cuts" pieces from a larger sheet of metal. With coining, materials used for circuit assembly pin 200 or 300 are formed in response to a fabrication technique that uses high forces to plastically deform the larger sheet. In this example and in an industrial application, a sheet of electrically conductive material is plastically formed by material cold flow process.

The foregoing description of the invention has been presented for purposes of illustration and description and is not intended to be exhaustive or to limit the invention to the precise form disclosed, and obviously many modifications and variations are possible in light of the above teaching. They simulate a user facing the apparatus and various parts are numbered.

What is claimed is:

1. A circuit assembly pin comprising:
- a solid barrel without an internal cavity having a cylindrical profile along an axis;
- a solid body without an internal cavity connected to the barrel, having a rectangular cuboid profile, and comprising a web and a fin, the web comprising a set of legs projecting substantially perpendicular to the axis of the barrel; and
- wherein the barrel, the body, the fin, and the web are comprised of one-piece electrically conductive material.

2. The circuit assembly pin of claim 1, wherein the barrel, the body, the web, the fin and the set of legs comprise a non-soldered electrically conductive material.

3. The circuit assembly pin of claim 1, wherein the web is shaped as a PCB pin web.

4. The circuit assembly pin of claim 1, wherein the fin is shaped as a PCB pin fin.

5. The circuit assembly pin of claim 1, wherein the set of legs is shaped as a set of PCB pin legs.

6. The circuit assembly pin of claim 1, wherein the barrel, the body, the web, the fin and the set of legs are composed of brass alloy.

7. The circuit assembly pin of claim 1, wherein the barrel, the body, the web, the fin and the set of legs are formed by a cold flow material fabrication process.

8. A circuit assembly pin comprising:
- a solid barrel without an internal cavity having a substantially cylindrical profile to be received by a first circuit board;
- a solid body without an internal cavity:
  - connected to the barrel;
  - having a substantially rectangular cuboid profile;
  - comprising a set of protrusions shaped as a set of legs to be inserted to a second circuit board, said protrusions having a substantially rectangular cuboid profile free of projections or depressions; and
- wherein the set of legs is substantially perpendicular to the barrel such that the first circuit board is substantially perpendicular to the second circuit board.

9. The circuit assembly pin of claim 8, wherein the barrel and the body are comprised of one-piece electrically conductive material.

10. The circuit assembly pin of claim 8, wherein:
the set of protrusions of the body is shaped as a PCB pin web and a PCB pin fin; and
the PCB pin web connects the set of legs to the body.

11. The circuit assembly pin of claim 8, wherein the barrel and the body are composed of brass alloy.

12. The circuit assembly pin of claim 8, wherein the barrel and the body are formed by a cold flow material fabrication process.

13. A circuit board assembly comprising:
a first circuit board with one or more sockets thereon;
a second circuit board with one or more sockets thereon;
a plurality of circuit assembly pins, each of the plurality of circuit assembly pins comprising:
a solid barrel without an internal cavity having a substantially cylindrical profile along an axis and shaped to be received by the one or more sockets of the first circuit board;
a solid body without an internal cavity:
connected to the barrel;
having a substantially rectangular cuboid profile;
comprising a set of protrusions shaped as a set of legs to be inserted to the one or more sockets of the second circuit board, the set of protrusions having a substantially rectangular cuboid profile free of projections or depressions;
wherein the set of protrusions is substantially perpendicular to the axis of the barrel such that, when the barrel is inserted in one of the sockets of the first circuit board and the legs are inserted into respective sockets of the second circuit board, the first circuit board is substantially perpendicular to the second circuit board.

14. The circuit board assembly of claim 13, wherein the barrel and the body are comprised of one-piece electrically conductive material.

15. The circuit board assembly of claim 13, wherein:
the set of protrusions of the body is shaped as a PCB pin web and a PCB pin fin; and
the PCB pin web connects the set of legs to the body.

16. The circuit board assembly of claim 13, wherein the barrel and the body are composed of brass alloy.

17. The circuit board assembly of claim 13, wherein the body and the barrel are formed by a cold flow material fabrication process.

* * * * *